(12) United States Patent
Lang et al.

(10) Patent No.: US 10,637,005 B2
(45) Date of Patent: Apr. 28, 2020

(54) METHOD OF PRODUCING A COMPONENT MODULE AND COMPONENT MODULE

(71) Applicant: OSRAM OLED GmbH, Regensburg (DE)

(72) Inventors: Erwin Lang, Regensburg (DE); Thomas Wehlus, Lappersdorf (DE); Arne Fleißner, Regensburg (DE); Sebastian Wittmann, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/776,000

(22) PCT Filed: Aug. 25, 2017

(86) PCT No.: PCT/EP2017/071430
§ 371 (c)(1),
(2) Date: May 14, 2018

(87) PCT Pub. No.: WO2018/037113
PCT Pub. Date: Mar. 1, 2018

(65) Prior Publication Data
US 2019/0173044 A1 Jun. 6, 2019

(30) Foreign Application Priority Data
Aug. 26, 2016 (DE) .................. 10 2016 115 902

(51) Int. Cl.
*H01L 21/00* (2006.01)
*H01L 23/10* (2006.01)
*H01L 51/52* (2006.01)

(52) U.S. Cl.
CPC ........ *H01L 51/529* (2013.01); *H01L 51/5237* (2013.01); *H01L 2251/5338* (2013.01); *H01L 2251/5361* (2013.01)

(58) Field of Classification Search
CPC ..................................................... H01L 51/524
USPC .... 438/29, 122, 121; 257/98, 625, 675, 706, 257/718
See application file for complete search history.

(56) References Cited

U.S. PATENT DOCUMENTS

| | | | |
|---|---|---|---|
| 6,853,151 B2 * | 2/2005 | Leong | H05B 33/0803 |
| 8,994,063 B2 * | 3/2015 | Lee | H01L 51/003 |
| | | | 257/100 |
| 2003/0134488 A1 | 7/2003 | Yamazaki et al. | |
| 2006/0273304 A1 | 12/2006 | Cok | |
| 2011/0018416 A1 * | 1/2011 | Sassa | H01L 51/529 |
| | | | 313/45 |
| 2011/0249425 A1 | 10/2011 | Aurongzeb et al. | |
| 2013/0161684 A1 | 6/2013 | Momma et al. | |
| 2018/0090697 A1 * | 3/2018 | Xu | H01L 51/0021 |

FOREIGN PATENT DOCUMENTS

| | | |
|---|---|---|
| DE | 10 2012 223 362 A1 | 6/2013 |
| EP | 3 190 330 A1 | 7/2017 |
| JP | 7-114347 A | 5/1995 |
| WO | 2016/035906 A1 | 3/2016 |

* cited by examiner

*Primary Examiner* — Calvin Lee
(74) *Attorney, Agent, or Firm* — DLA Piper LLP (US)

(57) ABSTRACT

A method of producing a component module includes providing a component holder having a curved upper side and a radiation-emitting bendable component, and bending and fastening the component to the upper side so that the component has a curved shape.

9 Claims, 6 Drawing Sheets

METHOD OF PRODUCING A COMPONENT MODULE AND COMPONENT MODULE

TECHNICAL FIELD

This disclosure relates to a method of producing a component module comprising a component holder and a radiation-emitting bendable component and a component module having a radiation-emitting curved component.

BACKGROUND

Radiation-emitting components are found in a large number of fields of use, inter alia for illumination and signalling purposes. Such components can be light-emitting diodes (LED for short) or organic light-emitting diodes (OLED for short). The latter can be produced inexpensively using thin film technology. When using a flexible substrate, for example, plastic such OLEDs are flexible or bendable.

OLEDs are constructed from a plurality of layers, for example, as a layer sequence of a substrate layer, a thin film encapsulation layer (TFE layer for short), an electrode, functional layers, that is to say emitter layer and hole-conduction layer, an electrode, a thin-film encapsulation layer and a protective layer.

Alternatively, an encapsulation cover can also be provided on an OLED without a thin film encapsulation layer and a protective layer arranged thereon that enables hermetic sealing of the active OLED layers and mechanical protection.

Bendable OLEDs can also be mounted in curved form. However, this leads to components encapsulated in the planar state and then bent, that have stresses in the component, especially at the interface between the OLED and the encapsulation cover. The stresses are accompanied by large restoring forces and can lead, inter alia, to delamination of the encapsulation cover and the holder. In particular, an OLED having an encapsulation made of flexible glass can be handled only with difficulties because of cracks associated with deformation of the glass. Such cracks cannot be completely avoided even by tempering, that is to say by heating of the material. There has hitherto not been a solution to the problem of the strong restoring forces that occur.

A possible field of use of bendable OLEDs is the automotive sector, in which OLEDs are used, for example, in driving direction indicators or as interior lighting.

To homogenize the temperature distribution and thus also the luminance distribution of OLEDs during operation at high luminous densities, in particular also in monochrome applications, for example, for red tail lights in the automobile sector and similar applications, a heat-distributing film is applied to the rear side of the OLEDs. That film is also referred to as a "heat spreader". The heat-distributing film also leads to a homogenization of the aging process.

In flexible OLEDs on plastic film carriers, a heat distribution by such a heat-distributing film is likewise necessary since the lateral thermal conductivity of the plastic film or the organic protective layers or plastic protective layer is not sufficient to distribute the heat in a sufficient manner within the component.

For use in particular in the automotive sector, integration of a heat-distributing region in a 2.5D or 3D module is important to achieve a homogeneous emission characteristic in combination with longevity. Integration of the heat-distributing region on the module plane is to take place without damage to the other OLED layers or mechanical stress on the different layers of the flexible OLED.

In OLEDs having a rigid glass substrate, integration of the heat-distributing region can already take place at the component level in that, for example, a heat-conducting film is laminated onto the rear side of the OLED. Such a film can be a 50 to 200 μm thick aluminum foil, copper foil, a graphite foil or the like. If such components are glued onto a plastic holder during the modulation, for example, the heat-distributing region is already integrated in the component.

2.5 D OLED modules can be produced by processing a flexible OLED in 2D form, which is then bent into the 2.5 D shape and glued into a 2.5 D component holder in a curved shape. If flexible OLEDs are applied to a metal foil (e.g. made of stainless steel, copper, aluminum or the like), then the OLED components have the heat-distributing region already integrated in the substrate. Since the modulus of elasticity of the metal foil is orders of magnitude greater than that of the organic functional layers, the organic protective layers and the plastic protective film, after bending the neutral fiber of this layer stack lies substantially in the center of the metal substrate. When the flexible OLED is bent, this leads to stress in the functional layers and in particular in the encapsulation layers. Therefore, the bending radii of such OLEDs on metal foils are limited to the range of a few centimeters and, as a result, the bending radii in the 2.5 D module are likewise limited.

The thinner the used metal foil, the smaller the bending radii can be achieved. Typical values for minimum bending radii of OLEDs on, for example, a 100 μm thick stainless steel foil (SUS for short, special use, stainless) are about 2 cm. If a thinner metal foil is used, this has a positive effect on the minimum bending radii that can be achieved. However, the thermal conductivity of such a metal foil is reduced accordingly. For OLEDs having a glass substrate for use as a back light in the automobile sector, for example, a 100 or 150 μm thick aluminum foil is used for heat distribution.

If flexible OLEDs are processed on a plastic film, as in OLEDs on glass, the heat-distributing region on the component level can be integrated onto the rear side of the OLED at the component level by laminating the heat-distributing region. If such plastic OLEDs are brought into the 2.5 D shape with, for example, a metal foil on the rear side, the physical behavior with regard to stress on the functional layers or the thin-film encapsulation layers is similar to that of OLEDs processed on a metal foil.

It could therefore be helpful to provide an improved component module having a flexible component and a method for the production thereof.

SUMMARY

We provide a method of producing a component module including providing a component holder having a curved upper side and a radiation-emitting bendable component, and bending and fastening the component to the upper side so that the component has a curved shape.

We also provide a component module including a component holder having a curved upper side, and a radiation-emitting component arranged in a curved shape on the upper side.

Figure 1:
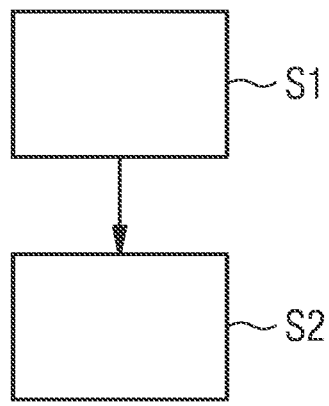
FIG. 1 illustrates method steps in the production of an example of a component module.

LIST OF REFERENCE SIGNS 1 component
2 component holder
3 component module
4 heat-distributing film
5 holder body
6 growth layer
7 adhesive
10 neutral fiber
40 heat-distributing region
44 galvanic layer
51 OLED
53 substrate
55 active OLED layers
57 arrow
59 encapsulation cover
S1, S2, S3, S4, S5, S6, S7, S8, S9, S10, S20, S21, S22, S31 method steps

DETAILED DESCRIPTION

Our method of producing a component module comprises providing a component holder having a curved upper side and a radiation-emitting bendable component, and bending and fastening the component on the upper side so that it has a curved shape.

The component module that can be produced by the method comprises a component holder having a curved upper side and a radiation-emitting component which is arranged in curved form on the upper side.

The method of producing a component module comprises, in particular, provision of a component holder having a curved upper side comprising a heat-distributing region on the upper side and a radiation-emitting region, and bending and fastening the component to the heat-distributing region so that the component takes a curved shape.

The component module produced by the method comprises a component holder having a curved upper side comprising a heat-distributing region on the upper side and a radiation-emitting component arranged in a curved shape on the heat-distributing region so that a neutral fiber runs in the interior of the curved component. The neutral fiber preferably runs outside the substrate, in particular between the electrodes and within the functional layers. The heat-distributing region is arranged on the upper side of the component holder. The material of the heat-distributing region can form a surface of the component holder on the upper side of the component holder, or adjacent thereto, for example, lying below an upper-surface protective layer.

A component module is a bendable component mounted on a component holder, for example, a flexible OLED. The region of the component holder on which the component is fastened has a curved upper side. It can also be a region of the same or almost the same thickness which is curved. In other words, both the upper side and the lower side are curved.

The component can thus be mounted on the heat-distributing region such that the former overlaps the latter, or vice versa, or the side edges of the component and the heat-distributing region are arranged flush one above the other.

The method produces components in 2.5 D form for integrated circuits. Holder shapes designed for special use and installation purposes are also possible, which facilitate installation of the finished component module or just enable them in a special environment. Especially in the latter case, the component module can also have more than one component.

Since the heat-distributing region is provided on the component holder, the method produces 2.5 D OLED modules with OLEDs on plastic having smaller bending radii compared to conventional modules in which the heat-distributing region is already integrated in the component plane in the 2D component. Bending radii of less than 1 cm are thus made possible. This is accompanied by an improvement in the storage life span of OLEDs in 2.5 D modules by reducing the stress in the functional layers and the thin-film encapsulation layers. This is achieved in that the neutral fiber, along which the mechanical load is minimal, runs in or near the functional layers.

Fastening the bendable component on the upper side of the component holder, in particular on the heat-distributing region of the component holder, can take place by lamination. The laminating comprises, for example, fixing the component to the heat-distributing region by an adhesive layer or a double-sided adhesive tape. Lamination allows the integral connection of the component and the component holder in a simple manner. The bending and the fastening step can be carried out at the same time during gluing, for example, by pressing the component onto the curved upper side of the component holder during gluing.

In the component module produced in this way, an adhesive layer or a double-sided adhesive tape is provided as an adhesive between the curved component and the upper side of the component holder, in particular, the heat-distributing region. The adhesive fixes the component on the heat-distributing region so that it follows the curvature of the upper side of the component holder. In other words, the component rests on the curved upper side of the component holder. The underside of the component and the top side of the component holder are adhesively bonded.

The component holder may be formed such that the heat-distributing region is shaped as a curved, continuously metallic region from the upper side to an underside of the component holder. Such a component holder allows very good deflection because of the thickness of the material. The component holder can be completely made of metals. Production of such a component holder can comprise milling, casting, punching or bending.

Alternatively, the component holder is formed by applying a heat-distributing layer to a curved upper side of a holder body so that the component holder then has a heat-distributing layer on the curved upper side of the holder body.

In this example, the holder body can be produced from plastic, for example, which enables a cost-effective production, for example, by injection molding. In an injection method, the heat-distributing layer, for example, formed as a metal paste can also be applied to the component holder. The injection steps can take place almost simultaneously or with a time interval there between that allows hardening of one of the materials.

Application of the heat-distributing layer may take place galvanically. The heat-distributing layer is a galvanically applied or electrochemically deposited layer on the top side of the holder body. The heat-distributing layer is applied by forming a growth layer on the top side of the holder body, the heat-distributing layer is then applied to the growth layer by galvanic deposition.

Alternatively, application of the heat-distributing layer can take place in that a heat-distributing film is laminated onto the upper side of the holder body. Such a lamination can be effected, for example, by adhesive bonding as a simple connection technique.

The production method can comprise bending and fixing of the component comprising connecting it to a curved encapsulation cover and fixing the arrangement of the curved encapsulation cover and the curved component on the component holder. Alternatively, bending and fixing the component can comprise fixing it on the curved upper side of the component holder and fixing a curved encapsulation cover on the arrangement of the component holder and the curved component. Such a component can be an OLED having active layers on a substrate. The active layers are protected by the encapsulation cover.

Before the component is fixed either to the encapsulation cover or the component holder, it is pre-bent. Pre-bending the component can be effected by an external stimulus, for example, a mechanical force that deforms the component. Such a deformation can be reversible if there is no subsequent fixing to the encapsulation cover or the component holder. It is also possible that the pre-bending and fixing of the component take place in the same step.

In the component module made of the component and the component holder produced in this manner, a pre-bent encapsulation cover is arranged on the component. The latter can be of glasses that make it possible to use the mechanical advantages of a vitreous encapsulation even in a curved component module. The encapsulation cover is pre-shaped such that its curvature corresponds to that of the rigid component holder. This makes it possible for the component holder and encapsulation cover to provide both good protection and fix the component in its curved shape. Application of an encapsulation in the pre-bent state solves the problem of the strong restoring forces.

It is possible in the method that the component is pre-bent and connected to the component holder such that the component holder encapsulates the component on its side facing it. In other words, the component holder also takes the protective function of the encapsulation cover which is now dispensable. In such an example it is advantageous if the component holder is light-transmissive, for example, made of glasses. With regard to pre-bending, the above-mentioned aspects apply, too. It is also possible here that pre-bending and fixing the component take place in the same step. The pre-bending is a deformation of the component, without the component holder being deformed at the same time. The latter is rigid.

When the component is initially brought into the desired shape and then connected to the already preformed component holder or the encapsulation cover, this reduces the stresses between the components and reduces the tendency of the component to detach since the restoring forces are reduced.

The method is very suitable for a bendable component comprising an organic light-emitting diode (OLED) and thus makes it possible to use the same for a plurality of illumination solutions.

By applying the heat-distributing film to the component holder, an improvement of the OLED during operation can be achieved by integration of heat-distributing films of any thickness, without exposing the OLED to unnecessary mechanical stress since, via the bending of the component, the neutral fiber runs within the OLED and, thus, the functional layers are only subjected to a low stress.

In the component modules produced in this way, the delamination probability of the different layers (in particular of cover layers, TFE layers, electrodes, organic layers and the like) is reduced during bending and fixing of the OLED in the 2.5 D holder shape. Heat-distributing films of any thickness can be used for luminance homogenization since the two functional units (heat-distributing region and OLED) are applied separately. Cost savings due to lower waste due to the avoidance of delamination due to the separation of the two production processes for the component and the heat-distributing region are a further advantage.

Our methods and modules are illustrated below on the basis of the drawings.

Figure 2A:
FIGS. 2a to 2c show intermediate products and end products in the production of the example of a component module according to the method illustrated in FIG. 1.
Figure 2B:
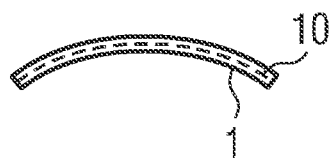
Figure 2C:
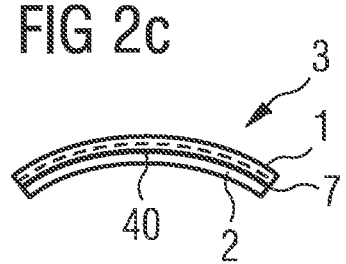

FIG. 1 shows method steps in the production of an example of a component module 3 (not shown in FIG. 1). Corresponding products are schematically illustrated in FIGS. 2a to 2c. They show an OLED as an example of a radiation-emitting flexible component 1 applied to a component holder 2 to thereby produce an example of a component module 3.

The method in FIG. 1 comprises providing a component holder 2 having a curved upper side comprising a heat-distributing region 40 on the upper side and providing a radiation-emitting flexible component 1. This is illustrated by block S1. In this example, the component 1 is a flexible OLED. The components 1, 2 can be provided simultaneously or in any order.

Block S2 illustrates bending and fixing the component 1 on the heat-distributing region 40 so that it takes a curved shape. The bending step can take place before the fastening step or at the same time so that the fastening is associated with the bending.

FIG. 2a shows a flexible OLED in a schematic representation as an example of the bendable radiation-emitting component 1. Such an OLED can be mounted and operated in the bent state if the associated mechanical stresses do not damage the OLED.

FIG. 2b shows the component 1 in a bent state. The dashed line illustrates the neutral fiber 10. The neutral fiber 10, also called the zero line, is the fiber or layer of a component whose length does not change during rotation or bending. The stress caused by bending is minimal along the neutral fiber 10. In the ideal case, no tensile, compressive or shear stress occurs. The neutral fiber 10 runs in the curved OLED which is integrated on a flexible plastic substrate and does not have a heat-distributing metal layer on its underside, within the functional layers or in the vicinity thereof. Due to the low stress in the functional layers, operation of the OLED is not impaired or hardly impaired despite bending.

FIG. 2c shows the component module 3 produced by fastening the bent component 1 to the component holder 2 by an adhesive 7. The component holder 2 has a curved upper side and, in this example, at least in the region on which the component 1 is arranged, is formed continuously from the upper side to a lower side of metals. This allows good heat dissipation so that the region on which the component 1 is arranged serves as a heat-distributing region 40. Such component holders 2 can be produced, for example, by milling from aluminum. Another production method for the component holder 2 is injection molding. Alternatively, other shaping or re-shaping methods, for example, stamping or bending, and/or other metals can be used. In these examples, the component holder 3 is made entirely of a thermally conductive material. It can be milled, for example, from aluminum or another heat-conducting material.

Fastening the component 1 can be effected by lamination. Lamination is a cohesive joining process that can be carried out under the action of heat or can be carried out cold, that is at ambient temperature. In the latter case, a cohesive connection between the components 1, 2 is produced with the addition of an adhesive agent 7.

The component 1 and component holder 2 can be connected by a double-sided adhesive tape as an example of an adhesive 7. Double-sided adhesive tape is a carrier material coated on both sides with pressure-sensitive adhesives. The adhesive tape is provided with easily detachable protective films on the adhesive surfaces. During the fastening process, the protective film of one side is usually first detached and the latter is adhesively bonded to the component 1 or the component holder 2. The protective film is then detached on the other side and the component 1 is adhesively bonded to the component holder 2.

Alternatively, an adhesive layer can also be used as a further example of the adhesive 7 between the component 1 and the component holder 2 to establish a connection of the two parts 1, 2. This can be effected by an adhesive film. An adhesive film is a layer of adhesive that adheres to both sides and is usually provided with protective films on both sides. During the fastening process, the protective film is usually first detached from one side and the adhesive film is adhesively bonded to the component 1 or the component holder 2. The protective film is then detached on the other side and the component is adhesively bonded to the component holder 2. Alternatively, the adhesive layer can also be formed by a liquid adhesive as a further example of an adhesive 7. The latter is applied in liquid form to the component 1 and/or the component holder 2, and the two parts 1, 2 are connected by curing the liquid adhesive.

Adhesive bonding by the above-described methods can be carried out by applying pressure.

The above-described adhesive methods can alternatively be carried out with the supply of heat, but otherwise in the same manner. As a result, for example, the viscosity of the adhesive is reduced which brings about a solid connection during cooling, or a chemical reaction is started in the adhesive. However, care must be taken to ensure that the heat does not damage the component 1.

Figure 3:
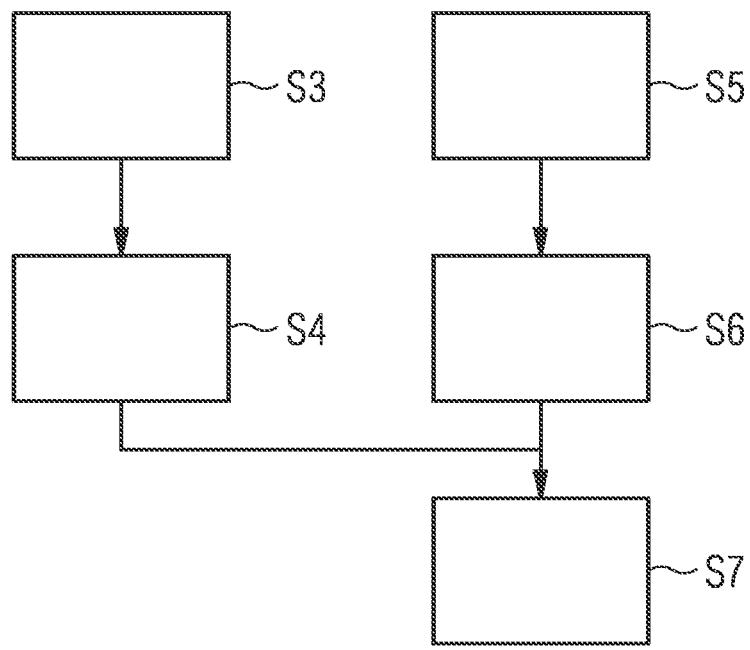
FIG. 3 illustrates method steps in the production of a further example of a component module.

FIG. 3 shows method steps in the production of a further example of a component module 2. Corresponding products are schematically illustrated in FIGS. 4a to 4e. The differences to the production of the previous example will be described below.

Figure 4A:
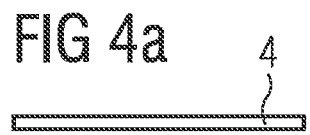
FIGS. 4a to 4e show intermediate products and end products in the production of the example of a component module according to the method illustrated in FIG. 3.

The method in FIG. 3 comprises providing a heat-distributing film 4 that can also be referred to as a heat-spreader film, illustrated by block S3. This can be, for example, an aluminum foil, a copper foil or a graphite foil. Such a heat-distributing film 4 is schematically illustrated in FIG. 4a. Furthermore, a holder body 5 having a curved upper side is provided. Such a holder body 5 can be made of plastic. The holder body 5 is dimensioned such that a 2.5 D component module can be produced therefrom.

Block S4 in FIG. 3 illustrates fixing the heat-distributing film 4 on the curved upper side of the holder body 5 to produce the component holder 2 with a heat-distributing layer as a heat-distributing region 40 on its upper side. This can be effected by laminating, as described above. A schematic representation of the component holder 2 produced in this way with the film 4 as the heat-distributing region 40, fixed with an adhesive 7 on the upper side of the component holder 2, is schematically illustrated in FIG. 4b.

In a further step, a bendable component 1 is provided, in this example a flexible OLED, illustrated by the block S5 in FIG. 3, is then bent, illustrated by the block S6, and is then fixed on the component holder 2, as illustrated by block S7. Bending and fixing can alternatively take place in the same step. The fastening can be carried out by lamination, as described above.

Figure 4C:
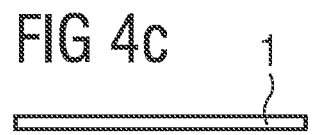
Figure 4B:
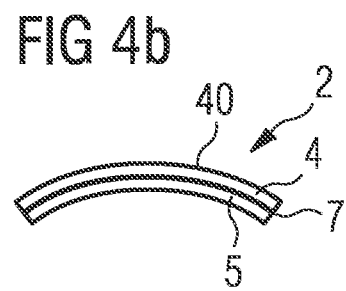

FIG. 4c shows an OLED as an example of the bendable radiation-emitting component 1.

Figure 4D:
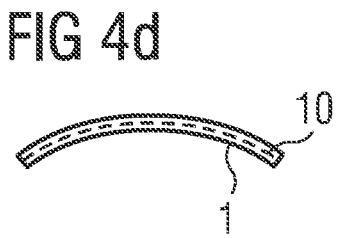

FIG. 4d shows the component 1 in a bent state. The dashed line 10 illustrates the neutral fiber.

Figure 4E:
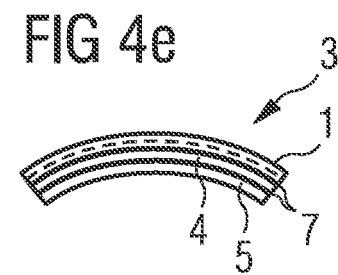

FIG. 4e shows the component module 3 produced by fastening the curved component 1 to the heat-distributing film 4 of the component holder 2. Both between the component 1 and the heat-distributing film 4 and between the heat-distributing film 4 and the holder body are adhesive means 7. The component module 3 shown comprises as essential compounds the component 1 and the component holder 2 and can in this form already be regarded as the component module 3 ready for use. Nevertheless, providing optional parts, for example, further attachments or coatings for protecting or influencing the emission characteristic is also possible.

The method in FIG. 3 is characterized in that the component module 3 is integrated by a multi-stage lamination process. In one step, lamination of the heat-distributing layer takes place, in the example described above this is the film 4, on the surface or surfaces of the holder body 5 to which the flexible component 1 is subsequently also adhesively bonded. Then, in a further step, the component 1 is adhesively bonded to the component holder 2.

Figure 5:
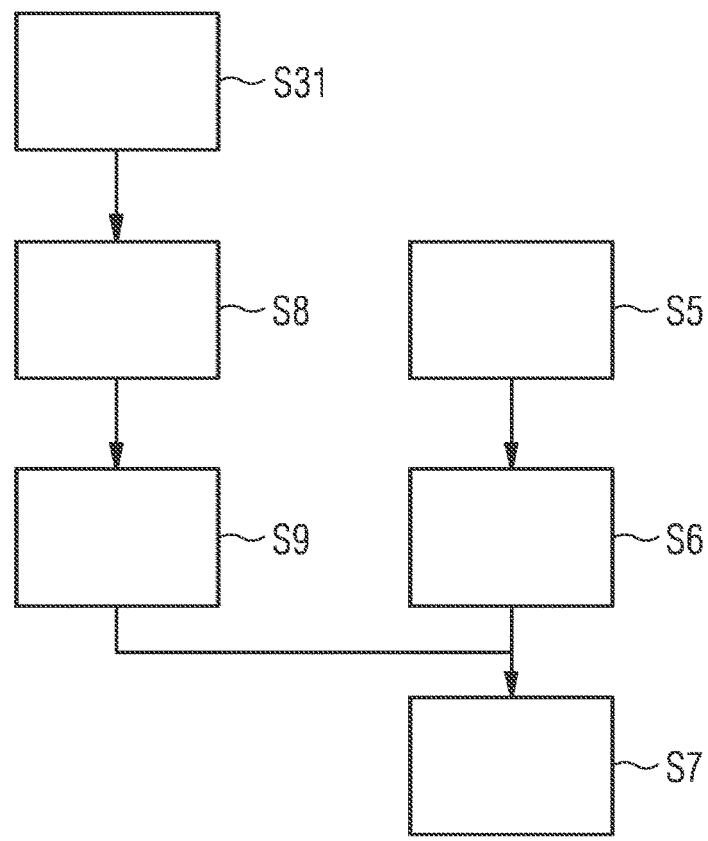
FIG. 5 illustrates method steps in the production of a further example of a component module.

FIG. 5 shows method steps in the production of a further example of a component module 3. Corresponding products are schematically illustrated in FIGS. 6a to 6f. The differences to the production of the previous example will be described below.

The method in FIG. 5 comprises, illustrated by block S31, providing a holder body 5 having a curved upper side. The holder body 5 is shown schematically in FIG. 6a and is dimensioned such that a 2.5 D component module can be produced therefrom.

A growth layer 6 is applied to at least one upper side of the holder body 5, as illustrated in block S8 of FIG. 5. The holder body 5 with the growth layer 6 is schematically illustrated in FIG. 6b. The growth layer 6 can be applied, for example, by printing or spraying.

In the following step, illustrated by block S9 of FIG. 5, an electrochemical deposition of a heat-distributing, galvanic layer 44 as a heat-distributing region 40 is done. This can be the previously mentioned metals, which can also be used for a heat-distributing film 4. As a result of the galvanic application which is a readily controllable process the desired thickness of the galvanic layer 44 can be set well and precisely. The holder body 5 with its layer 44 as a heat-distributing region 40 on the upper side is schematically illustrated in FIG. 6c.

In further steps, a bendable component 1, in this example an OLED, illustrated by block S5 in FIG. 5, is bent, illustrated by block S6, and is fixed on the component holder 2, as illustrated by block S7. These steps can be carried out in the manner described in connection with FIGS. 3 and 4c to 4e.

Figure 6A:
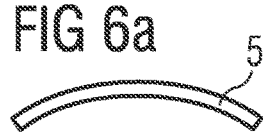
FIGS. 6a to 6f show intermediate products and end products in the production of the example of a component module according to the method illustrated in FIG. 5.
Figure 6D:
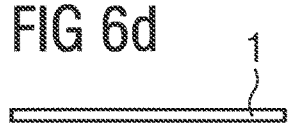
Figure 6B:
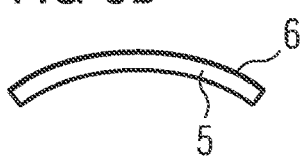

FIG. 6d shows an OLED as an example of the bendable radiation-emitting component 1.

Figure 6E:
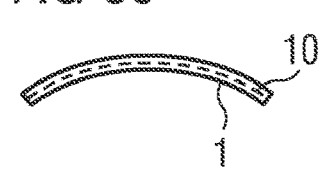
Figure 6C:
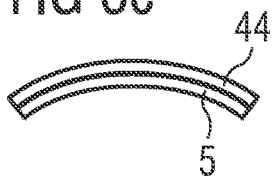

FIG. 6e shows the component 1 in a bent state. The dashed line 10 illustrates the neutral fiber.

Figure 6F:

FIG. 6f shows the component module 3, produced by fastening the bent component 1 to the heat-dissipating, galvanic layer 44 of the component holder 2. An adhesive 7 is between the component 1 and the layer 44.

In this example, as well as in the preceding, integration of the heat-distributing region 40 takes place independently of the integration of the OLED onto plastic in the 2.5 D module. As a result, it is possible that the neutral fiber 10, when the OLED is bent, is located in or close to the functional OLED layers, in a distance range of less than 50 μm, preferably less than 10 μm, even more preferably less than 5 μm, as a result of which the stress on these layers can be minimized.

Figure 7:
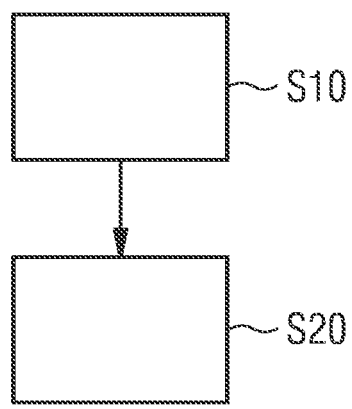
FIG. 7 illustrates method steps in the production of an example of a component module.

FIG. 7 shows method steps in the production of an example of a component module 3 (not shown in FIG. 7).

The method in FIG. 7 comprises providing a component holder 2 having a curved upper side and providing a radiation-emitting component 1. This is symbolized by block S10. In this example, the component 1 is a flexible OLED 51. Providing the components 1, 2 can be carried out simultaneously or in any order.

Block S20 symbolizes the bending and fixing of the component 1 on the upper side of the component holder 2 so that the component 1 has a curved shape. The pre-bending of the component 1 without the component holder 2 being bent at the same time as in the conventional production can take place before the fastening step or at the same time so that the fastening is associated with the bending.

Figure 8:
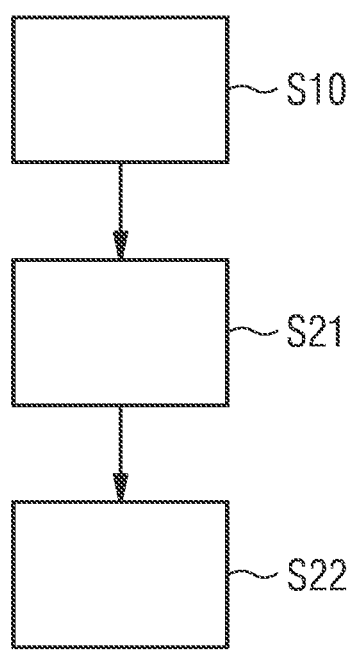
FIG. 8 illustrates method steps in the production of an example of a component module.

FIG. 8 shows method steps for the variant in which the bending step, symbolized by block S21, is done before the fastening step, symbolized by block S22. In the bending step S21, the pre-bending of the component 1 comprises connecting it with a curved, that is pre-bent, and advantageously rigid encapsulation cover 59 so that the component 1 takes the curved shape. The component 1 is pre-bent without the already preformed encapsulation cover 59 being bent at the same time. However, this step can be carried out before or at the same time as the fastening to the cover 59. In the fastening step S22, the pre-bent arrangement of the encapsulation cover 59 and the component 1 is then fixed on the component holder 2, for example, laminated. Alternatively, it is possible for the component 1 to be bent first and then fixed on the component holder 2 and then to place and fix the encapsulation cover 59.

Figure 9:
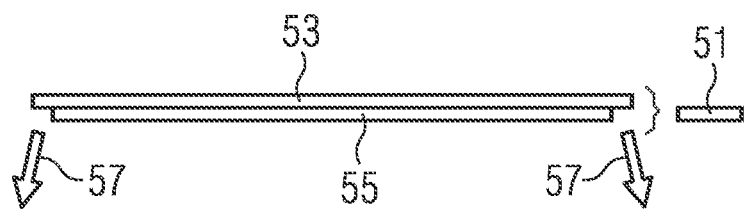
FIG. 9 schematically shows the structure of an exemplary OLED as an example of a component.

FIG. 9 schematically shows the structure of an OLED 51 as an example of a component 1 that can be mounted in a curved manner in the manner described above. The OLED 51 comprises a hermetic substrate 53, for example, glass or metal, that serves on the one hand as a carrier of active OLED layers 55, but also protects it from environmental influences from the carrier side. To protect the other side of the active OLED layers 55, an encapsulation is still required. The component holder 2 can take over this function when the active OLED layers are arranged facing the component holder 2. A cover 59 is then no longer required but can optionally be provided. The component holder 2 with an encapsulation function is advantageously designed to be transparent to enable light emission through it. In an example, the component holder 2 is already pre-bent, of constant or almost constant thickness and of glass or transparent plastic.

Figure 10:
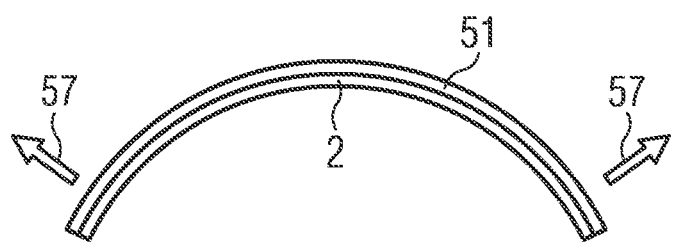
FIG. 10 shows an example of a component module.

In a conventional process flow, the OLED 51 is applied to a component holder 2 and encapsulated and the entire arrangement is then deformed to produce the component module. Tempering enables, for example, permanent deformation of the vitreous component holder 2 which forces and holds the OLED 51 mounted thereon into the curved shape. Normally, strong forces then occur at the edge of the component holder 2 that push the OLED 51 back into its planar shape and lead to detachment. FIG. 10 shows the curved arrangement of an OLED 51 with the component holder 2. By deformation of the entire arrangement in the same process step, restoring forces act, indicated by arrows 57, in particular at the edges.

Figure 11:
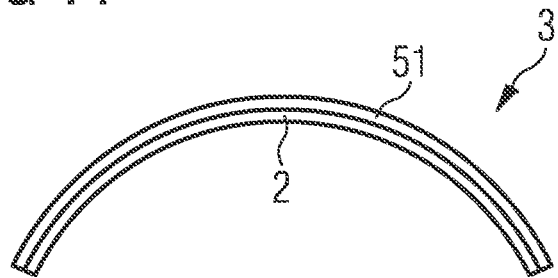
FIG. 11 shows an example of a component module.

Deviating from the conventional production method, during the assembly of an above-described OLED 51 as a component 1 on an already curved component holder 2, the OLED 51 is initially pre-bent and then connected to the rigid component holder 2. The bent component holder 2 can be produced from tempered glass or plastic. The pre-bending of the OLED 51 can be effected by external stimulus or can already include a permanent deformation prior to application to the component holder 2. In the first case, the OLED can be pre-bent, for example, by mechanical force action and placed onto the component holder and fastened so that it then retains its deformation as a result of the fixing. Permanent pre-bending before fastening can be achieved by tempering. If the OLED 51 is pre-bent, there are no restoring forces that can lead to detachment, or they are significantly reduced, indicated by the absent arrows, as shown in FIG. 11, which illustrates the component module 3 comprising the OLED 51 and the component holder 2. This force-neutral connection of the OLED 51 and the component holder 2 prevents the restoring forces. Connection of the OLED 51 and the component holder 2 can be effected by lamination. Further exemplary connecting techniques are the use of an adhesive, for example, a glass, or soldering or melting.

Figure 12:
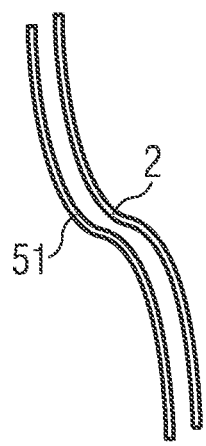
FIG. 12 shows the components of an example of a component module.

The above-described process flow results in high flexibility in the shaping of the component module 3 with the OLED 51 and the component holder 2, which at the same time also serves directly as an encapsulation cover. This is illustrated in FIG. 12, which shows a pre-bent OLED 51 and a component holder 2 for an S-shaped component module.

Figure 13:
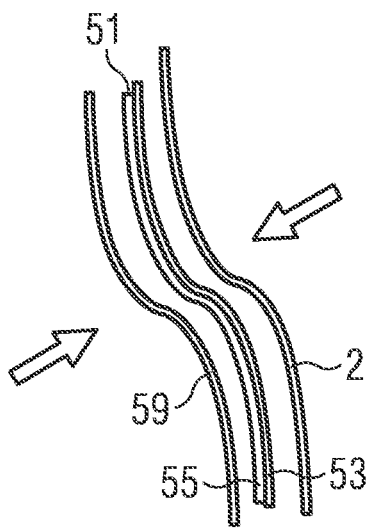
FIG. 13 shows the components of an example of a component module.

FIG. 13 illustrates a process in which thin glass for an encapsulation cover 59 as well as a component holder 2 for an S-shaped component module 3 are provided.

The OLED 51 comprises a substrate 53, for example, thin glass or metal on which active OLED layers 55 are arranged. Further, a pre-bent, rigid component holder 2 is provided, which can be produced, for example, from glass or metal and which can be, but does not need to be transparent. A pre-bent encapsulation cover 59 of the module 3 can, for example, be produced from a bent thin glass. During production of the component module 3, the OLED 51 is initially brought into the desired shape. Pre-bending the OLED 51 can be effected by external stimulus or be permanent, as already described above. The OLED 51 is then connected to the likewise preformed encapsulation cover 59, which can be carried out, for example, by laminating, adhesive bonding, soldering or melting. This minimizes stress in the connection or interface between the two components as long as the preformed shape is maintained, and additionally reduces the tendency of the laminate to detach from a possible further holder which is subsequently attached. The arrangement of the interconnected OLED 51 and the encapsulation cover 59 is then connected to the curved rigid component holder 2. This can be achieved, for example, by laminating, adhesive bonding, soldering or melting. The component module 3 thus offers a hermetically sealed, at least one-sided transparent and mechanical protection of the active OLED layers 55.

In an alternative process for the components shown in FIG. 13, the OLED 51 is pre-bent and then first connected to the rigid component holder 2. In the same or in a subsequent step, the OLED 51 is hermetically encapsulated with the thin glass as a cover 59.

Lamination in the pre-bent state reduces the forces at the interface and the tendency to detach from the component holder 2 and also from the encapsulation cover 59. The lamination or other fixing with individual covers as encapsulation covers 59 allows, for example, the use of pre-cut thin glass as a hermetically sealed encapsulation in combination with a rigid component holder 2.

The features of the examples can be combined. This disclosure is not restricted by the description on the basis of the examples. Rather, our methods and modules encompass any novel feature and any combination of features, which in particular includes any combination of features in the appended claims, even if the feature or combination itself is not explicitly specified in the claims or examples.

This application claims priority of DE 10 2016 115 902.6, the subject matter of which is incorporated herein by reference.

The invention claimed is:

1. A method of producing a component module comprising:
   providing a component holder having a curved upper side and a radiation-emitting bendable component, and
   bending and fastening the component to the upper side, so that the component has a curved shape,
   wherein the component holder is formed by applying a heat-distributing layer to a curved upper side of a holder body, and the heat-distributing layer is applied by a heat-distributing film laminated onto the upper side of the holder body and is arranged between the component and the holder body.

2. A method of producing a component module comprising:
   providing a component holder having a curved upper side and a radiation-emitting bendable component, and
   bending and fastening the component to the upper side, so that the component has a curved shape,
   wherein the component holder is formed by applying a heat-distributing layer to a curved upper side of a holder body, and the heat-distributing layer is applied by forming a growth layer on the upper side of the holder body and the heat-distributing layer is applied on the growth layer by galvanic deposition.

3. The method according to claim 2, wherein bending and fixing the component comprises connecting the component with a curved encapsulation cover, and fixing the arrangement of the curved encapsulation cover and the curved component on the component holder,
   or bending and fixing the component comprises fixing the component on the curved upper side of the component holder and fixing a curved encapsulation cover on the arrangement of the component holder and the curved component.

4. The method according to claim 2, wherein the component is bent and connected to the component holder so that the component holder encapsulates the component on a side facing the component holder.

5. The method according to claim 2, wherein the bendable component is an organic light-emitting diode.

6. The method according to claim 2, wherein the component holder comprises a heat-distributing region on the upper side and the bending and fixing of the component proceeds on the heat-distributing region so that the component forms into a curved shape.

7. The method according to claim 6, wherein production of the component holder comprises milling, casting, stamping or bending so that the heat-distributing region is formed as a curved and continuously metallic region from the upper side to an underside of the component holder.

8. The method according to claim 2, wherein, during fastening, the bendable component is laminated on the upper side of the component holder.

9. The method according to claim 8, wherein the lamination comprises fastening the component on the upper side of the component holder by an adhesive layer or a double-sided adhesive tape.

* * * * *